United States Patent
Park

(10) Patent No.: US 7,881,090 B2
(45) Date of Patent: Feb. 1, 2011

(54) CONTENT ADDRESSABLE MEMORY (CAM) ARRAY CAPABLE OF IMPLEMENTING READ OR WRITE OPERATIONS DURING SEARCH OPERATIONS

(75) Inventor: Kee Park, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 123 days.

(21) Appl. No.: 12/405,154

(22) Filed: Mar. 16, 2009

(65) Prior Publication Data

US 2010/0232195 A1 Sep. 16, 2010

(51) Int. Cl.
*G11C 15/00* (2006.01)

(52) U.S. Cl. .............. 365/49.17; 365/49.1; 365/49.11; 365/49.12; 365/49.15; 365/49.16; 365/49.18

(58) Field of Classification Search ............ 365/49.1, 365/49.11, 49.12, 49.15, 49.16, 49.17, 49.18; 711/108

See application file for complete search history.

(56) References Cited

U.S. PATENT DOCUMENTS

| | | | |
|---|---|---|---|
| 5,488,578 A * | 1/1996 | Yamada ................ | 365/49.17 |
| 6,563,727 B1 * | 5/2003 | Roth et al. ............. | 365/49.15 |
| 6,597,595 B1 | 7/2003 | Ichiriu et al. | |
| 6,707,693 B1 | 3/2004 | Ichiriu | |
| 6,760,242 B1 * | 7/2004 | Park et al. ............. | 365/49.15 |
| 6,775,168 B1 * | 8/2004 | Park et al. ............. | 365/49.15 |
| 6,804,134 B1 * | 10/2004 | Proebsting et al. ..... | 365/49.1 |
| 6,829,153 B1 * | 12/2004 | Park et al. ............. | 365/49.17 |
| 6,879,532 B1 * | 4/2005 | Proebsting et al. ..... | 365/203 |
| 6,922,751 B2 * | 7/2005 | Regev et al. ........... | 711/108 |
| 7,002,823 B1 | 2/2006 | Ichiriu | |
| 7,237,156 B1 | 6/2007 | Srinivasan et al. | |

OTHER PUBLICATIONS

U.S. Appl. No. 12/195,299, filed Aug. 20, 2008, Gharia.

* cited by examiner

*Primary Examiner*—Hoai V Ho
*Assistant Examiner*—Kretelia Graham
(74) *Attorney, Agent, or Firm*—Mahamedi Paradice Kreisman LLP; William L. Paradice

(57) ABSTRACT

A read operation and a search operation are performed during the same cycle within a CAM system including a CAM array by: (1) forcing a non-matching condition to exist in the row of the CAM array selected for the read operation, (2) comparing the read data value with the search data value outside of the CAM array to determine whether a match exists, and (3) prioritizing the results of the search operation performed within the CAM array and the results of the comparison performed outside of the CAM array to provide a final search result.

19 Claims, 7 Drawing Sheets

US 7,881,090 B2

CONTENT ADDRESSABLE MEMORY (CAM) ARRAY CAPABLE OF IMPLEMENTING READ OR WRITE OPERATIONS DURING SEARCH OPERATIONS

FIELD OF THE INVENTION

The present invention relates to a content addressable memory (CAM) array. More specifically, the present invention relates to a CAM array that can implement read or write operations at the same time that a search operation is being performed.

RELATED ART

Content addressable memory (CAM) arrays have been implemented using static random access memory (SRAM) cells. FIG. 1A is a circuit diagram of a conventional SRAM cell 100, which includes cross coupled inverters 101-102 and access transistors 111-112, which are coupled to word line WL and bit lines BL-BL#. Data is written to SRAM cell 100 by applying a high voltage to word line WL (thereby turning on access transistors 111-112), and applying the desired data value to complementary bit lines BL and BL#. The data value is stored on complementary storage nodes SN and SN# within SRAM cell 100. FIG. 1A illustrates a logic '1' data value stored in SRAM cell 100, wherein storage node SN is held at a logic '1' state (i.e., pulled up to a high voltage of $V_{CC}$) and storage node SN# is held at a logic '0' state (i.e., pulled down to a low voltage of ground).

FIG. 1B is a waveform diagram illustrating a read operation of SRAM cell 100. Bit lines BL-BL# are initially held at the $V_{CC}$ supply voltage, and word line WL is initially held at ground. At time T0, the $V_{CC}$ supply voltage is applied to word line WL. Under these conditions, the logic '0' state of storage node SN# causes the voltage on bit line BL# to be pulled down, as illustrated. The data bit is identified by the voltage difference that exists across the bit lines BL-BL#. As illustrated in FIG. 1B, the voltage levels of the storage nodes SN and SN# are distorted from the ideal levels during a read operation. That is, the voltage on storage node SN is pulled down below the $V_{CC}$ supply voltage, and the voltage on storage node SN# is pulled up above the ground voltage. In a conventional SRAM device, this voltage distortion is acceptable, as long as the data is not corrupted. However, this voltage distortion will cause operational problems if SRAM cell 100 is used to implement a CAM device.

FIG. 2A is a circuit diagram of a CAM cell 200, which is implemented using two SRAM cells 201-202, each of which is identical to the SRAM cell 100 of FIG. 1A. SRAM cell 201 includes cross-coupled inverters 211-212 (having storage nodes SNX-SNX#) and access transistors 213-214, which are coupled to a first set of bit lines BLX-BLX#. Similarly, SRAM cell 202 includes cross-coupled inverters 221-222 (having storage nodes SNY-SNY#) and access transistors 223-224, which are coupled to a second set of bit lines BLY-BLY#. The gates of access transistors 213-214 and 223-224 are coupled to a common word line WL. In the illustrated example, a data bit having a value of '1' is stored in CAM cell 200, wherein storage nodes SNX and SNY# are held at logic '1' states ($V_{CC}$), and storage nodes SNX# and SNY are held at logic '0' states (ground).

Storage nodes SNX and SNY are coupled to the gates of search transistors 231 and 232, respectively. Transistors 231 and 232 are commonly coupled to a match line (MATCH) as illustrated. Search lines SL and SL# are coupled to the gates of search transistors 241 and 242, respectively. Transistors 241 and 242 are coupled to respective transistors 231 and 232, and also to ground, as illustrated.

A search operation to CAM cell 200 is performed as follows. The MATCH line is initially pre-charged to a logic high voltage (e.g., $V_{CC}$). A search data value is then applied to complementary search lines SL and SL#. In the illustrated example, a search data value having a value of '1' is applied to complementary search lines SL and SL#, wherein search line SL is held at a logic '1' state ($V_{CC}$) and search line SL# is held at a logic '0' state (ground). In the illustrated example, search transistors 232 and 241 are turned off (non-conductive), such that the MATCH line remains in the pre-charged high state, thereby indicating that the search data value matches the data value stored in CAM cell 200.

If a read operation were performed at the same time as the above-described search operation, voltage distortion (see, FIG. 1B) will exist on the storage node SNY. This voltage distortion may cause the voltage on storage node SNY to increase to a level sufficient to result in a significant charge leakage path through transistor 232. Under these conditions, the MATCH line may discharge (through transistors 232 and 242), thereby erroneously indicating a non-matching result for the search operation.

FIG. 2B illustrates CAM cell 200, wherein a search data value having a value of '0' is applied to complementary search lines SL and SL#. In this case, search transistors 231 and 241 should turn on, such that the MATCH line discharges to a low state, thereby indicating that the search data value does not match the data value stored in CAM cell 200. However, if a read operation were performed at the same time as this search operation, voltage distortion will exist on the storage node SNX (see, FIG. 1B). This voltage distortion may cause the voltage on storage node SNX to decrease to a level that does not fully turn on transistor 231, thereby resulting in a relatively high impedance path between the MATCH line and ground through transistors 231 and 241. Under these conditions, the discharge of the MATCH line will occur relatively slowly, thereby requiring slow operation of the comparison circuit that resolves the state of the MATCH line.

For these reasons, search operations and read operations cannot be performed concurrently within a CAM array implemented using SRAM cells.

Dynamic random access memory (DRAM) cells exhibit an even greater voltage distortion than SRAM cells during read operations. Thus, the above-described problems arising from voltage distortion during read operations are even more pronounced in CAM cells implemented using DRAM cells.

FIG. 3A is a circuit diagram of a CAM cell 300, which is implemented by DRAM cells 301 and 302. DRAM cell 301 includes storage capacitor 312 and access transistor 311, which is coupled to word line WL and bit line BL as illustrated. DRAM cell 302 includes storage capacitor 322 and access transistor 321, which is coupled to word line WL and bit line BL# as illustrated. Data is written to CAM cell 300 by applying a high voltage to word line WL (thereby turning on access transistors 311 and 321), and applying the desired data value to complementary bit lines BL and BL#. The data value is stored on complementary charge storage nodes CN and CN# within DRAM cells 301 and 302. FIG. 3A illustrates a logic '1' data value stored in CAM cell 300, wherein charge storage node CN is maintained at a logic '1' state (i.e., charged to a high voltage near $V_{CC}$) and charge storage node SN# is maintained at a logic '0' state (i.e., discharged to a low voltage near ground).

FIG. 3B is a waveform diagram illustrating a read operation of CAM cell 300. Bit lines BL-BL# are initially pre-charged to an intermediate voltage of $V_{CC}/2$, and word line WL is initially held at ground. At time T0, a control voltage approximately equal to 1.5 times the $V_{CC}$ supply voltage is applied to word line WL, thereby turning on access transistors 311 and 321. Under these conditions, capacitor 312 discharges to bit line BL, thereby slightly increasing the voltage on bit line BL (and reducing the voltage of charge storage node CN). A sense amplifier (not shown) coupled to bit lines BL and BL# amplifies the small voltage difference that exists between these bit lines, such that bit line BL (and charge storage node CN) is pulled up toward $V_{CC}$ and bit line BL# (and charge storage node CN#) is pulled down toward ground. As illustrated in FIG. 3B, the voltage levels of the charge storage nodes CN and CN# are severely distorted from the ideal levels (i.e., $V_{CC}$ and ground) during a read operation (i.e., the cell data is almost destroyed).

Search transistors 331-332 and 341-342 enable search operations to be implemented by CAM cell 300. Charge storage nodes CN and CN# are coupled to the gates of search transistors 331 and 341, respectively, and search lines SL and SL# are coupled to the gates of search transistors 342 and 332, respectively. A search operation to CAM cell 300 is performed as follows. The MATCH line is initially pre-charged to a logic high voltage (e.g., $V_{CC}$). A search data value is then applied to complementary search lines SL and SL#. In the illustrated example, a search data value having a value of '1' is applied to complementary search lines SL and SL#, wherein search line SL is held at a logic '1' state ($V_{CC}$) and search line SL# is held at a logic '0' state (ground). In this case, search transistors 332 and 341 are turned off (non-conductive), such that the MATCH line remains in the pre-charged high state, thereby indicating that the search data value matches the data value stored in CAM cell 300. Clearly, CAM cell 300 cannot be read during this search operation, because the read operation would result in an increased voltage on charge storage node CN# (see, FIG. 3B), which would provide a conductive path between the MATCH line and ground (through transistors 341 and 342). Under these conditions, the MATCH line would discharge, thereby erroneously indicating a non-matching result for the search operation.

Similarly, if a search data value having a value of '0' is applied to complementary search lines SL and SL# (i.e., SL='0' and SL#='1') then transistors 331 and 332 would turn on, such that the MATCH line discharges to a low state, thereby indicating that the search data value does not match the data value stored in CAM cell 300. Again, CAM cell 300 cannot be read during this search operation, because the read operation would result in a decreased voltage on charge storage node CN (see, FIG. 3B), which would prevent a transistor 331 from fully turning on. Under these conditions, the MATCH line would discharge relatively slowly (if at all), thereby resulting in slow (or inaccurate) operation of the comparison circuit that resolves the state of the MATCH line.

Soft errors may occur within the memory cells of a CAM device. A soft error occurs when charged particles corrupt the information stored in a memory cell of the CAM array. Charged particles can originate, for example, from radioactive materials, cosmic rays, or from the interaction of a high-energy particle with a semiconductor material. Soft error testing of CAM devices is implemented by performing read operations.

More specifically, soft errors are detected by reading data stored in the CAM array, and comparing this read data with known data previously written to the CAM array. Because read operations cannot be performed at the same time as search operations (for reasons described above), soft error testing is limited to idle cycles of the CAM device (i.e., cycles when search operations are not being performed within the CAM device). Soft error testing performed in this manner is referred to as 'idle cycle based background scanning'.

Identifying the presence of soft errors (and therefore the soft error rate) within a CAM array is becoming increasingly important. However, idle cycle based background scanning results in a low and unpredictable scan rate, because scanning can only be performed while no search operations are being performed. It would therefore be desirable to have an improved method and apparatus for determining soft error rate in a CAM array. It would further be desirable for this method to be applicable to CAM arrays implementing either DRAM or SRAM technology.

SUMMARY

Accordingly, the present invention provides a CAM system that enables read and search operations to be performed simultaneously during the same memory cycle. During each read operation, the match line corresponding with the row being read is disabled (e.g., discharged), such that this row is effectively 'removed' from any search operation that may be performed during the same cycle. If a search operation is performed during the same cycle as the read operation, the search data value is provided to the CAM array, and a first search result is generated, wherein the first search result ignores the row being read. The read data value is compared with the search data value within a comparator located outside of the CAM array, thereby generating a second search result, which corresponds with the row being read. A priority comparator determines whether the first search result or the second search result has a higher priority, and provides the higher priority search result as the output search result.

In this manner, search operations and read operations may be performed simultaneously within the CAM system, such that voltage distortions that occur during the read operation do not adversely effect the search operation. As a result, soft error testing may be performed at a high, predictable frequency, which does not depend on the frequency of the search operations.

The present invention will be more fully understood in view of the following description and drawings.

DETAILED DESCRIPTION

Figure 4:
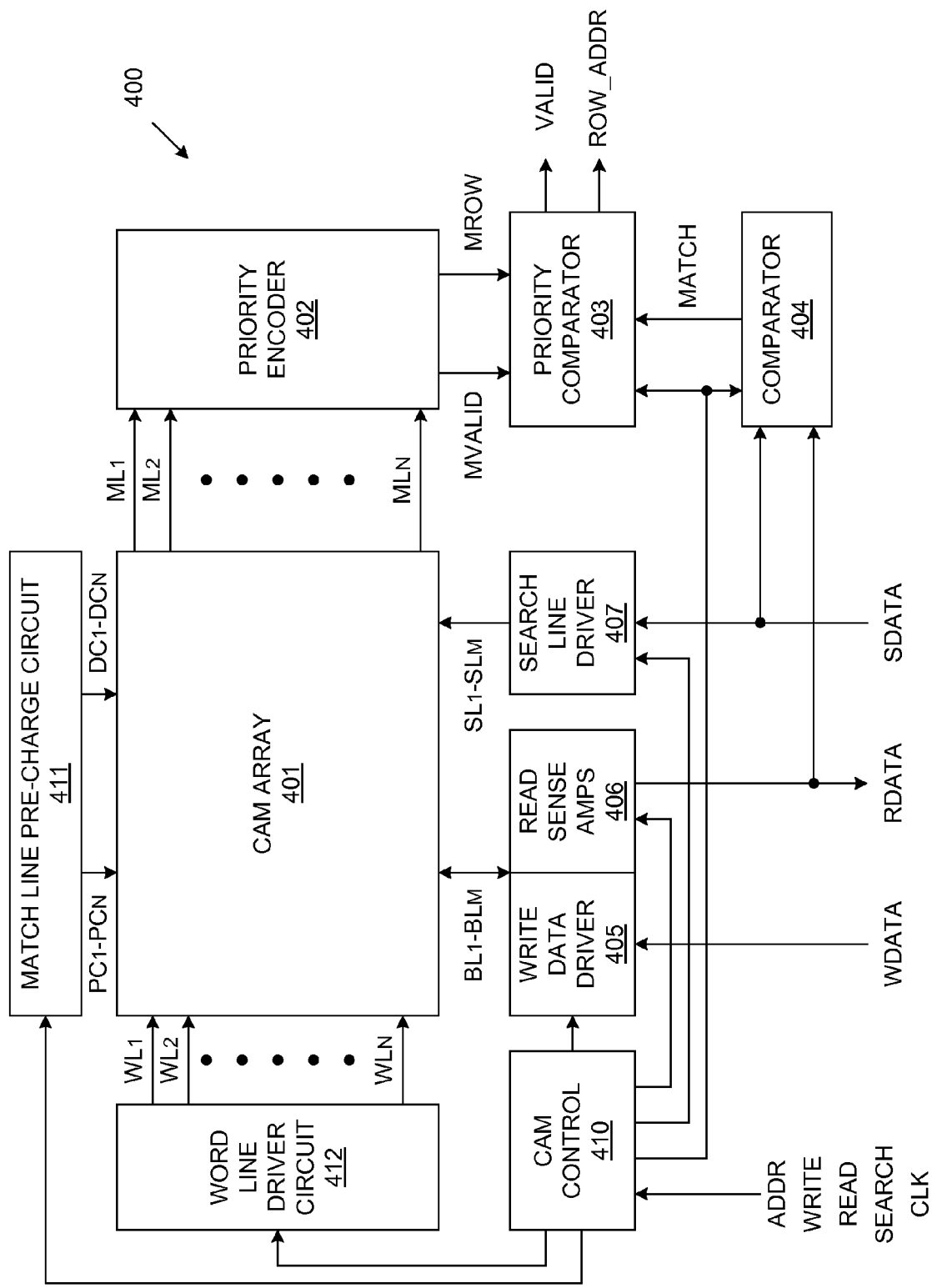
FIG. 4 is a block diagram of a CAM system in accordance with one embodiment of the present invention.

FIG. 4 is a block diagram of a CAM system 400 in accordance with one embodiment of the present invention. CAM system 400 includes CAM array 401, priority encoder 402, priority comparator 403, comparator 404, write data driver circuit 405, read sense amplifiers 406, search line driver circuit 407, CAM controller 410, match line pre-charge driver circuit 411 and word line driver circuit 412.

CAM controller 410 is coupled to receive control and address signals, including a clock signal (CLK); a search request signal (SEARCH), which is activated to initiate a search operation; a read request signal (READ), which is activated to initiate a read operation; a write request signal (WRITE), which is activated to initiate a write operation; and an address (ADDR), which specifies an address within CAM array 401 to be read/written. The SEARCH, READ, WRITE and ADDR signals are latched within CAM controller 410 in response to edges of the CLK signal.

Write data driver circuit 405 is configured to receive a write data value (WDATA), which is written to CAM array 401 during a write operation. Read sense amplifiers 406 are configured to provide a read data value (RDATA), which is the result of a read operation from CAM array 401. Search line driver circuit 407 is configured to receive a search data value (SDATA), which is provided to CAM array 401 during a search operation. The read data value (RDATA) and the search data value (SDATA) are provided to comparator 404. As described in more detail below, comparator 404 enables read operations to be performed at the same time as search operations, in accordance with one embodiment of the present invention.

In the described embodiments, CAM array 401 includes N rows of CAM cells, wherein each row of CAM cells has a corresponding word line (WL) and a corresponding match line (ML). The word lines of rows 1 to N of CAM array 401 are labeled $WL_1$-$WL_N$ and the match lines of rows 1 to N of CAM array 401 are labeled $ML_1$-$ML_N$. Match lines $ML_1$-$ML_N$ are coupled to priority encoder 402. Match line pre-charge circuit 411 provides pre-charge control signals $PC_1$-$PC_N$ and discharge control signals $DC_1$-$DC_N$ to CAM array 401. The match lines $ML_1$-$ML_N$ are pre-charged in response to pre-charge control signals $PC_1$-$PC_N$, respectively, and discharged in response to discharge control signals $DC_1$-$DC_N$, respectively.

Figure 5:
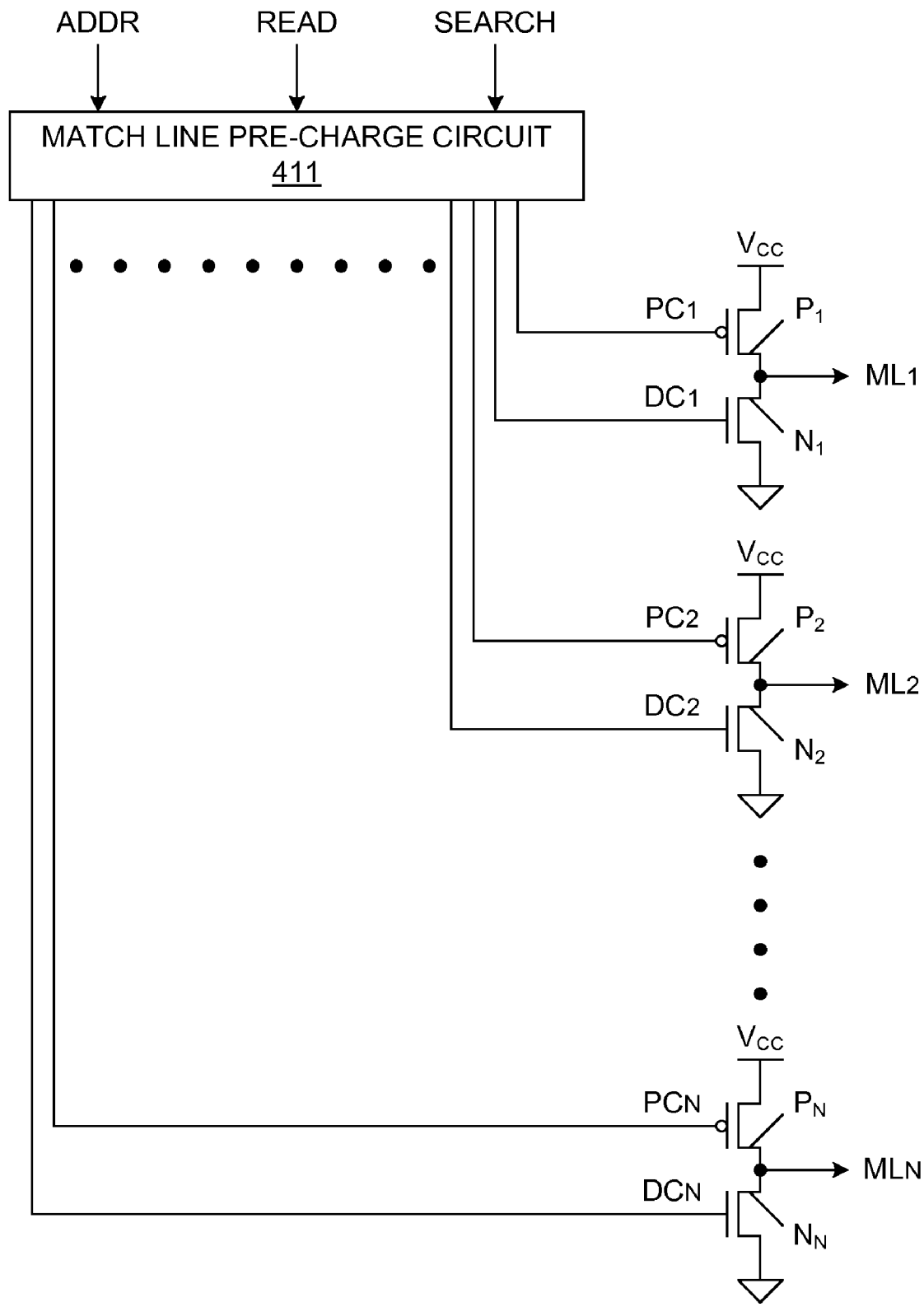
FIG. 5 is a circuit diagram illustrating the match line precharge control circuit of the CAM system of FIG. 4, in accordance with one embodiment of the present invention.

FIG. 5 is a circuit diagram illustrating the manner in which the match lines $ML_1$-$ML_N$ are pre-charged in response to the pre-charge control signals $PC_1$-$PC_N$ and discharged in response to the discharge control signals $DC_1$-$DC_N$. Pre-charge control signals $PC_1$-$PC_N$ are provided to the gates of p-channel transistors $P_1$-$P_N$, respectively. When a pre-charge control signal $PC_X$ is activated low, the corresponding p-channel transistor $P_X$ is turned on, thereby coupling the corresponding match line $ML_X$ to the positive voltage supply $V_{CC}$. The pre-charge control signal $PC_X$ is subsequently de-activated high, thereby turning off the corresponding p-channel transistor $P_X$, leaving the match line $ML_X$ in a pre-charged state.

Discharge control signals $DC_1$-$DC_N$ are provided to the gates of n-channel transistors $N_1$-$N_N$, respectively. When a discharge control signal $DC_X$ is activated high, the corresponding n-channel transistor $N_X$ is turned on, thereby coupling the corresponding match line $ML_X$ to ground. The discharge control signal $DC_X$ is subsequently de-activated low, thereby turning off the corresponding n-channel transistor $N_X$, leaving the match line $ML_X$ in a discharged state.

Figure 1A:
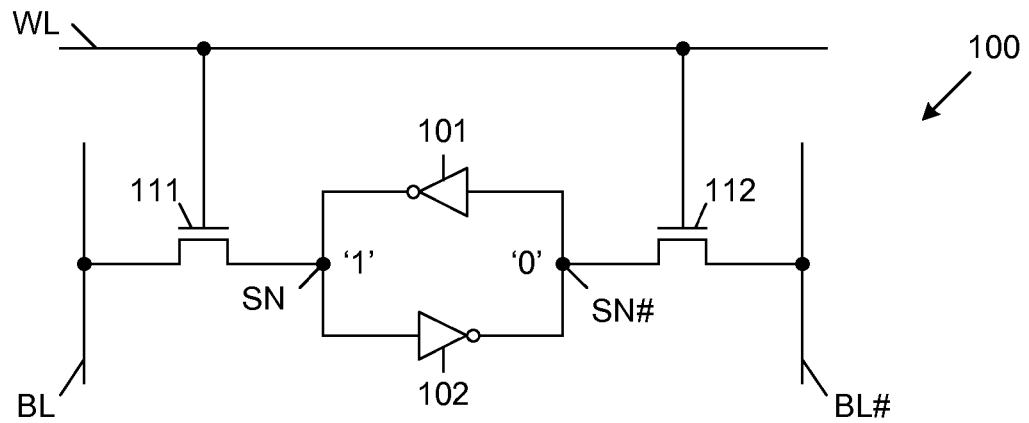
FIG. 1A is a circuit diagram of a conventional SRAM cell.
Figure 1B:
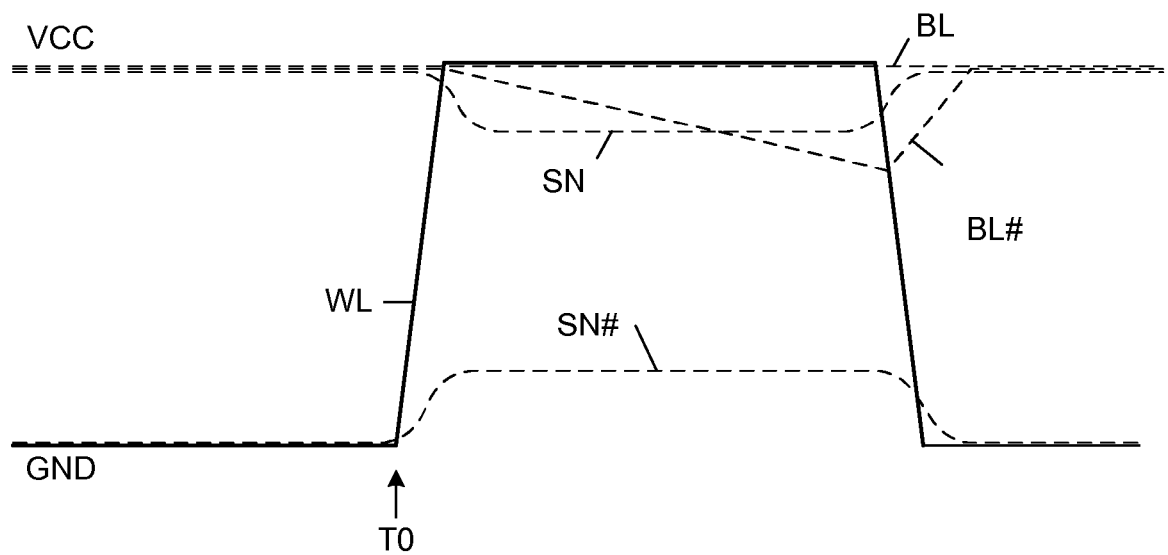
FIG. 1B is a waveform diagram illustrating a read operation of the SRAM cell of FIG. 1A.
Figure 2A:
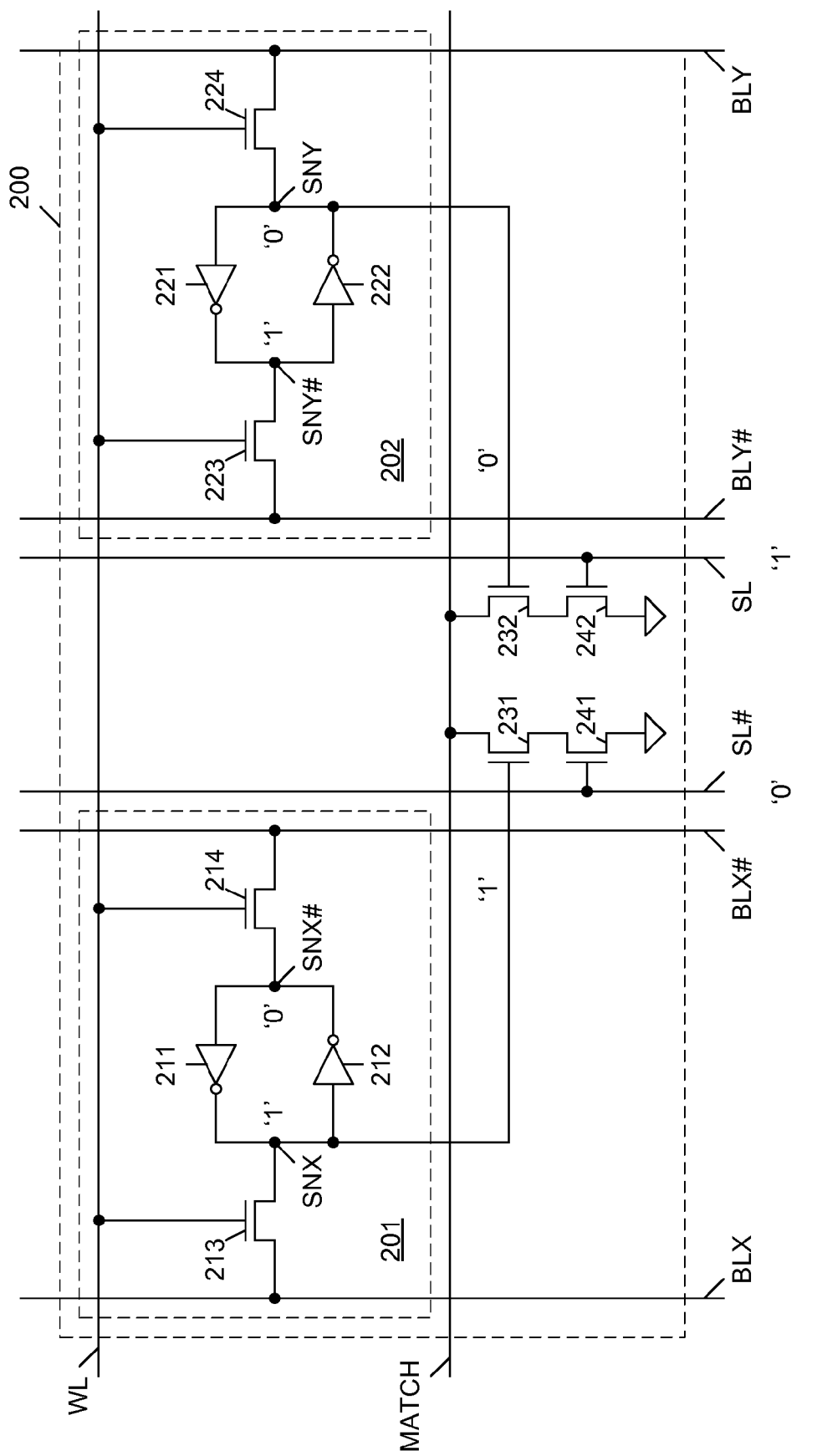
FIG. 2A is a circuit diagram of a conventional CAM cell, which is implemented with two of the SRAM cells of FIG. 1A.
Figure 2B:
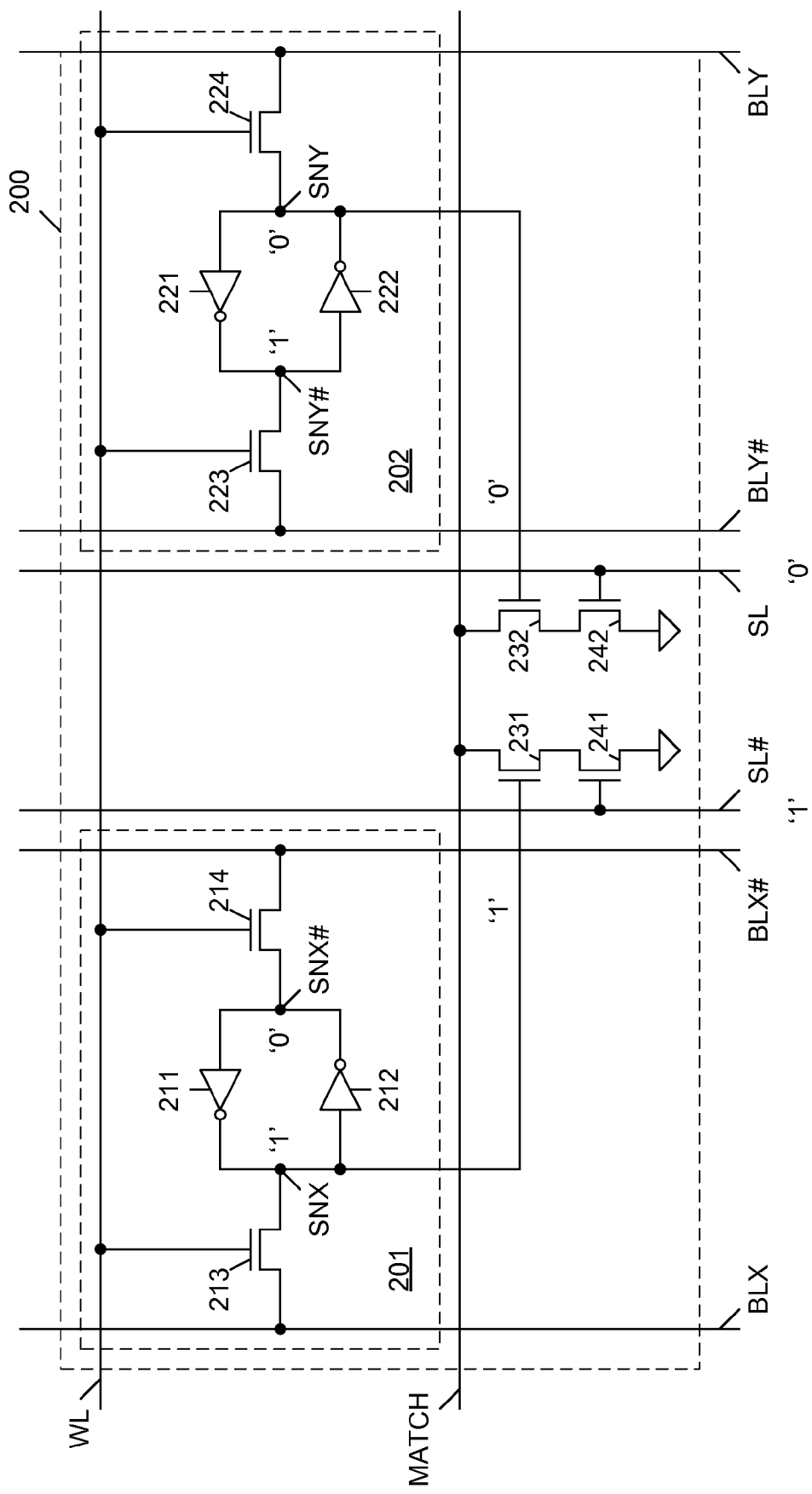
FIG. 2B is a circuit diagram illustrating a search operation being performed to the conventional CAM cell of FIG. 2A.
Figure 3A:
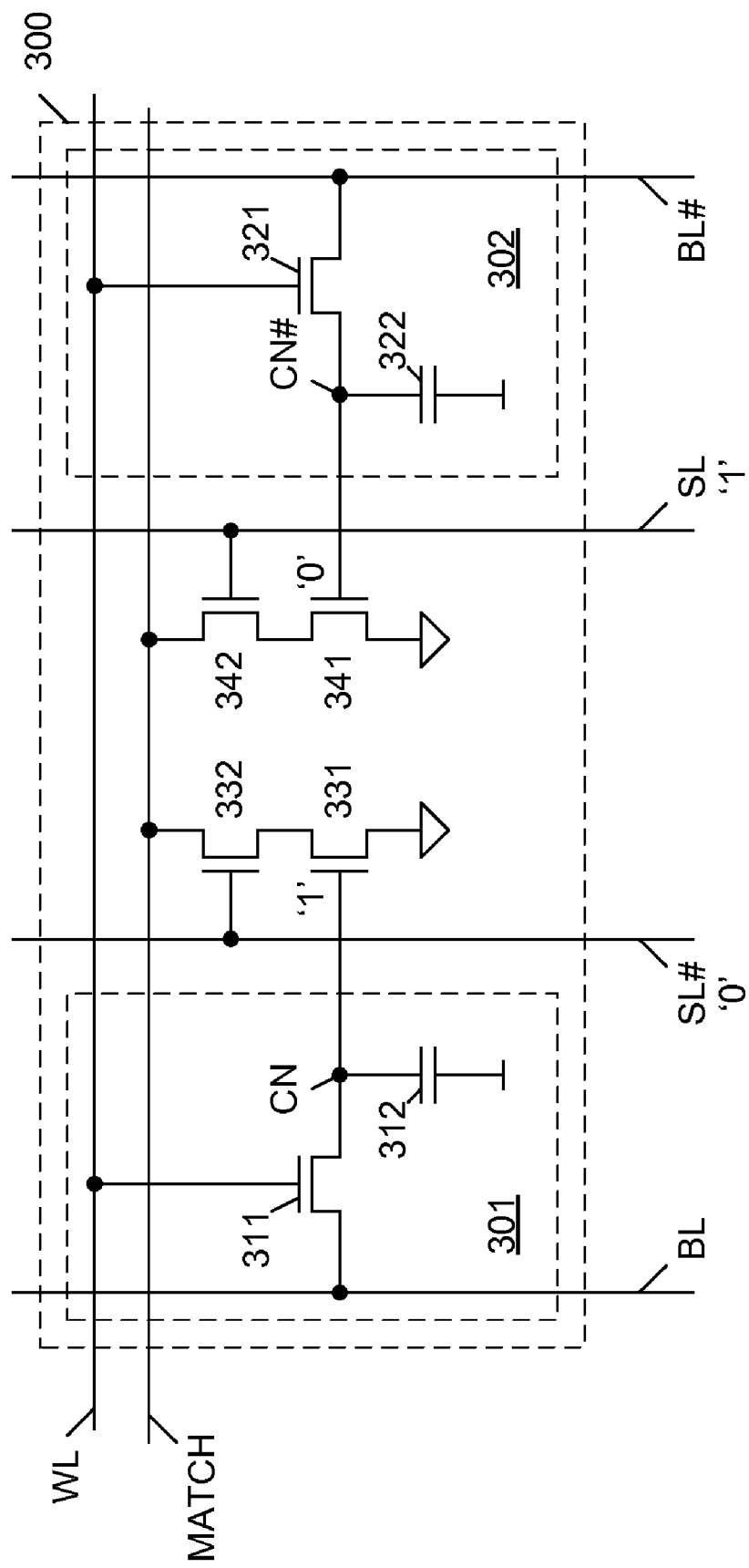
FIG. 3A is a circuit diagram of a conventional CAM cell, which is implemented by DRAM cells.
Figure 3B:
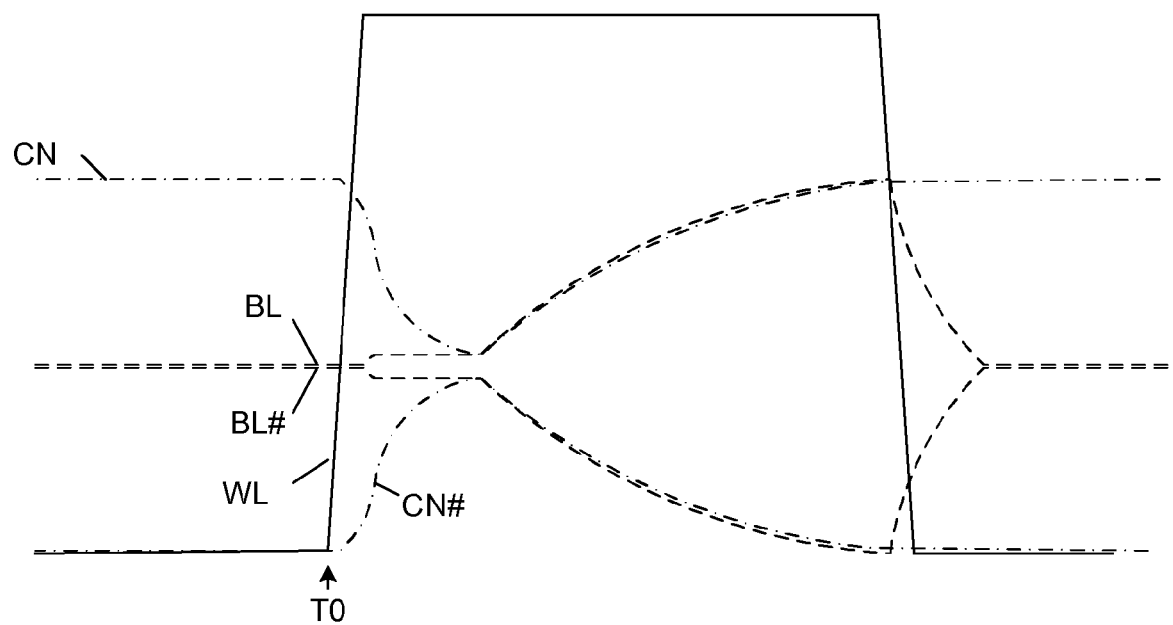
FIG. 3B is a waveform diagram illustrating a read operation of the CAM cell of FIG. 3A.

CAM array 401 also includes M columns of CAM cells, wherein each column of CAM cells includes a set of bit lines for carrying write data (WDATA) and read data (RDATA) to and from the CAM cells in the column. Each column of CAM cells also includes a set of search lines for carrying search data (SDATA) to the CAM cells in the column. The bit lines of columns 1 to M of CAM array 401 are labeled $BL_1$-$BL_M$ and the search lines of columns 1 to M of CAM array 401 are labeled $SL_1$-$SL_M$. In the embodiments described herein, it us understood that $BL_1$ typically refers to more than one physical bit line, and $SL_1$ typically refers to more than one physical search line. For example, $BL_1$ may refer to a complementary bit line pair, such as BL/BL# as illustrated in FIG. 3A, or complementary bit line pairs BLX/BLX# and BLY/BLY# as illustrated in FIGS. 2A-2B. Similarly, SL1 may refer to a complementary search line pair, such as SL/SL# as illustrated in FIGS. 2A-2B and 3A. In the described embodiments, the CAM cells can be implemented using SRAM cells (see, e.g., FIG. 2A) or DRAM cells (see, e.g., FIG. 3A). CAM array 401 can also be implemented using other types of CAM cells in other embodiments of the present invention. In one embodiment, adjacent bit lines $BL_1$-$BL_M$ and search lines $SL_1$-$SL_M$ are twisted to minimize the effects of capacitive coupling of these lines.

CAM controller 410 controls write data driver circuit 405, read sense amplifiers 406, search line driver circuit 407, match line pre-charge circuit 411 and word line driver circuit 412 in the manner described below to implement write, read and search operations. In accordance with the present invention, read operations and search operations can be performed concurrently within CAM system 400.

Write Operations

Upon detecting an activated write request signal (WRITE) (e.g., at a rising edge of the CLK signal), CAM controller 410 latches the corresponding write address (ADDR) and causes write data driver circuit 405 to latch the corresponding write data value (WDATA). CAM controller 410 provides the latched write address ADDR to word line driver circuit 412. In response, word line driver circuit 412 decodes the write address ADDR and activates the word line associated with the row identified by the write address. Write data driver circuit 405 drives the write data value WDATA onto the bit lines of CAM array 401, such that the write data value WDATA is written to the addressed row of CAM array 401.

Read Operations

Upon detecting an activated read request signal (READ) (e.g., at a rising edge of the CLK signal), CAM controller 410 latches the corresponding read address (ADDR). CAM controller 410 provides the latched read address ADDR to word line driver circuit 412 and match line pre-charge circuit 411. In response, word line driver circuit 412 decodes the read address ADDR, and activates the word line ($WL_X$) associated with the row identified by the read address. The activated word line ($WL_X$) causes the data stored in the addressed row to be provided on bit lines $BL_1$-$BL_N$. CAM controller 410 activates the read sense amplifiers 406, such that the data provided on bit lines $BL_1$-$BL_N$ is sensed, latched, and provided as the read data value RDATA.

Upon receiving the read address ADDR, match line pre-charge circuit 411 also decodes the read address ADDR, and activates the discharge control signal ($DC_X$) associated with the row identified by the read address. As described above in connection with FIG. 5, activating the discharge control signal ($DC_X$) discharges the match line ($ML_X$) associated with the row being read. Discharging the match line ($ML_X$) in this manner prevents a match from being indicated on this match line during the read operation. As a result, the row being read is effectively 'disabled' during a concurrent search operation. As described in more detail below, this enables a search operation to be performed at the same time as a read operation.

In accordance with an alternate embodiment of the present invention, the circuitry of FIG. 5 is modified such that the word line control signals $WL_1$-$WL_N$ are provided to the gates of n-channel transistors $N_1$-$N_N$, respectively, instead of the discharge control signals $DC_1$-$DC_N$. In this embodiment, when a word line signal $WL_X$ is activated high during a read operation (or a write operation), the corresponding n-channel transistor $N_X$ is turned on, thereby coupling the corresponding match line $ML_X$ to ground, effectively disabling this match line if a concurrent search operation is being performed.

Search Operations

Upon detecting an activated search request signal (SEARCH) (e.g., at a rising edge of the CLK signal), CAM controller 410 initiates a search operation within CAM array 401, wherein the search data (SDATA) received by search line driver 407 is compared with the data stored in CAM array 401. In accordance with one embodiment of the present invention, CAM controller 410 may simultaneously initiate a read operation and a search operation. That is, CAM controller 410 may detect that the read request signal (READ) and the search request signal (SEARCH) are both activated at the same rising edge of the CLK signal, and in response, initiate a read operation and a search operation at the same time. Because read operations can be performed at the same time as search operations, soft error testing does not have to be performed as a background operation (i.e., during idle or non-search periods). Rather, soft error testing can be performed on a regular basis, regardless of the frequency of the search operations. This advantageously results in a high and predictable soft error scanning rate.

CAM controller 410 initiates a search operation in the following manner. As long as no read operation is to be performed during the same cycle as the search operation, CAM controller 410 causes match line pre-charge circuit 411 to activate each of the pre-charge control signals $PC_1$-$PC_N$, thereby pre-charging all of the match lines $ML_1$-$ML_N$. However, if a read operation is to be performed during the same cycle as the search operation, then CAM controller 410 causes match line pre-charge circuit 411 to activate the discharge control signal $DC_X$ associated with the row to be read (and de-activate the pre-charge control signal $PC_X$ associated with the row to be read), and activate the pre-charge control signals (and de-activate the discharge control signals) associated with all of the other rows within CAM array 410, which are not being read.

After the pre-charge operation is complete, CAM controller 410 causes search line driver 407 to drive the received search data SDATA to CAM array 401 on the search lines $SL_1$-$SL_M$. Under these conditions, pre-charged match lines associated with any rows that store data that matches the search data will remain in the pre-charged state, while pre-charged match lines of any rows that store data that does not match the search data are discharged. Priority encoder 402, which is coupled to the match lines $ML_1$-$ML_N$, determines whether any of the match lines remains in the pre-charged state, and if so, identifies the highest priority match line that remains in the pre-charged state. If at least one of the match lines remains in the pre-charged state, priority encoder 402 activates a valid match signal MVALID to indicate that a valid match was detected, and also generates a match address value MROW that identifies the row address associated with the highest priority match line that remained in the pre-charged state. If none of the match lines remains in the pre-charged state, priority encoder 402 de-activates the valid match signal MVALID to indicate that no valid match was detected within CAM array 401. Priority encoder 402 passes the valid match signal MVALID and the match address value MROW to priority comparator 403. The valid match signal MVALID and the match address value MROW may be considered a 'first search result'.

Priority comparator 403 receives the latched READ and SEARCH signals from CAM controller 410, and in response, determines whether a read operation is being performed at the same time as the search operation. If a read operation is not being performed at the same time as the search operation, then priority comparator 403 provides the valid match signal MVALID and the match address value MROW as the valid output signal VALID and the output address value ROW_ADDR, respectively.

However, if a read operation is being performed at the same time as the search operation, then priority comparator 403 is controlled to take into account the results provided by comparator 404. Comparator 404 operates in the following manner. Comparator 404 is enabled if a read operation is being performed at the same time as a search operation (i.e., both the latched READ and SEARCH signals are activated). When enabled, comparator 404 compares the read data (RDATA) provided by read sense amplifiers 406 with the search data (SDATA) provided to comparator 404. As described above, if a read operation and a search operation are being performed during the same cycle, the match line of the row being read is not pre-charged. As a result, the match line associated with the row being read does not indicate whether the search data SDATA matches the data stored in the row being read. For this reason, comparator 404 compares the data from the row being read (RDATA) with the search data SDATA to determine whether a match exists. If a match exists, comparator 404 activates a match control signal MATCH. If a match does not exist, comparator 404 de-activates the match control signal MATCH. Comparator 404 provides the match control signal MATCH to priority comparator 403. Priority comparator 403 also receives the latched read address ADDR from CAM controller 410. The match control signal MATCH and the latched read address ADDR may be considered a 'second search result'.

Priority comparator 403 operates as follows in response to the first search result (MVALID, MROW) provided by priority encoder 402 and the second search result (ADDR, MATCH) provided by comparator 404. If the valid match signal MVALID is activated, but the match control signal MATCH is de-activated, then a match was detected by priority encoder 402, but not by comparator 404. Under these conditions, priority comparator 403 provides the valid match signal MVALID as the valid output signal VALID and the match address value MROW as the output address value ROW_ADDR.

Conversely, if the match control signal MATCH is activated, but the valid match signal MVALID is de-activated, then a match was detected by comparator 404, but not by priority encoder 402. Under these conditions, priority comparator 403 provides the match control signal MATCH as the valid output signal VALID and the latched read address ADDR as the output address value ROW_ADDR.

If both the match control signal MATCH and the valid match signal MVALID are activated, then priority comparator 403 determines whether the row identified by the latched read address ADDR or the row identified by the match address value MROW has a higher priority.

If the row identified by the match address value MROW has a higher priority than the row identified by the latched read address ADDR, then priority comparator 403 provides the match address value MROW as the output address value ROW_ADDR (and the valid match signal MVALID as the valid output signal VALID).

However, if the row identified by the match address value MROW has a lower priority than the row identified by the latched read address ADDR, then priority comparator 403 provides the latched read address ADDR as the output address value ROW_ADDR (and the match control signal MATCH as the valid output signal VALID). The VALID and ROW_ADDR signals provided by priority comparator 403 may be considered a 'third search result'.

Note that priority comparator 403 will de-activate the valid output signal VALID if the valid match signal MVALID and the match control signal MATCH are both de-asserted.

The present invention will now be described in connection with several examples. For example, assume that a search operation results in matches within rows 4 and 19 of CAM array 401 (i.e., match lines $ML_4$ and $ML_{19}$ remain charged while the remaining match lines are discharged.) In this case, priority encoder would activate the valid match signal, MVALID. Further assume that the priority of each row is inversely related to the row number (i.e., row 1 has the highest priority and row N has the lowest priority). In this case, priority encoder 402 would determine that the match occurring in row 4 represents the highest priority match, and provide a match address value MROW identifying row 4 to priority comparator 403.

If priority comparator 403 determines that no read operation is being performed at the same time as the search operation, then priority encoder 403 activates the valid output signal VALID and provides an output address value ROW_ADDR identifying row 4.

However, if priority comparator 403 determines that a read operation is being performed at the same time as the search operation, then priority comparator 403 will consider the results provided by comparator 404. Assume that a concurrent read operation is being performed from row 2 of CAM array 401. As described above, the corresponding match line $ML_2$ corresponding with the row being read is discharged, and will indicate a non-match condition regardless of whether a match actually exists. However, comparator 404 determines whether the data stored in row 2 of CAM array 401 matches the search data SDATA. If comparator 404 determines that a match exists, then comparator 404 activates the match control signal MATCH. In response, priority comparator 403 compares the priority of the row associated with the read address ADDR (i.e., row 2) with the priority of the row associated with the match address value MROW (i.e., row 4). In the present example, the priority comparator 403 will determine that the priority of the row associated with the read address ADDR (i.e., row 2) is greater than the priority of the row associated with the match address value MROW (i.e., row 4). In response, priority comparator 403 will provide an output address value ROW_ADDR identifying row 2.

Note that if the concurrent read operation were being performed from row 15 of CAM array 401, and comparator 404 determined that a match exists between the data read from row 15 and the search data, priority comparator 403 would determine that the priority of the row associated with the match address value MROW (i.e., row 4) is greater than the priority of the row associated with the read address ADDR (i.e., row 15). In response, priority comparator 403 would provide an address value ROW_ADDR identifying row 4.

In the manner described above, CAM system 400 can perform a search operation and a read operation during the same memory cycle, wherein the row being read is subjected to read control voltages, but not search control voltages, within the CAM array 401. As a result, the read voltages developed within to the selected row of CAM array 401 do not have an adverse affect on a search operation being performed within the CAM array 401. That is, the read voltages developed within the selected row will not result in a match condition being erroneously detected as a non-match condition as in the prior art. Similarly, the read voltages developed within the selected row will not require long match line sensing periods to ensure that a non-match condition is properly detected, as in the prior art.

Although the present invention has been described in connection with various embodiments, it is understood that variations of these embodiments would be obvious to one of ordinary skill in the art. Thus, the present invention is limited only by the following claims.

I claim:

1. A method of operating a content addressable memory (CAM) system comprising:
   receiving a signal for performing a read operation from a selected row of a CAM array;
   in response to receiving the signal, decoding the signal to activate a discharge signal from a plurality of discharge signals during a first cycle of the CAM system, wherein the discharge signal is associated with the selected row of the CAM array;
   performing the read operation from the selected row of a CAM array during the first cycle of the CAM system, wherein a read data value is read from the selected row;
   performing a search operation within each row of the CAM array except for the selected row of the CAM array during the first cycle of the CAM system, wherein a search data value is provided to the CAM array during the search operation;
   providing a first search result in response to the search operation;
   comparing the read data value with the search data value to provide a second search result, the comparison occurring outside of the CAM array; and
   providing a third search result in response to the first search result and the second search result.

2. The method of claim 1, further comprising performing the read operation at the same time as performing the search operation.

3. The method of claim 1, further comprising providing the first search result at the same time as providing the second search result.

4. The method of claim 1, wherein the first search result identifies a first row of the CAM array that stores data matching the search data value.

5. The method of claim 4, wherein providing the third search result comprises comparing a priority of the selected row with a priority of the first row to determine which of these rows has a higher priority.

6. The method of claim 1, wherein the search operation comprises placing a match line associated with the selected row of the CAM array in a state associated with a non-matching condition.

7. The method of claim 6, wherein the discharge signal discharges the match line associated with the selected row of the CAM array to place the selected row of the CAM array in the state associated with a non-matching condition.

8. The method of claim 6, wherein the search operation further comprises placing match lines associated with the rows of the CAM array other than the selected row in a state associated with a matching condition.

9. The method of claim 8, wherein a plurality of pre-charge lines pre-charges the match lines associated with the rows of the CAM array other than the selected row to place the rows of the CAM array other than the selected row in the state associated with a matching condition.

10. A method of operating a content addressable memory (CAM) system comprising:
receiving a signal for performing a read operation from a selected row of a CAM array;
in response to receiving the signal, decoding the signal to activate a discharge signal from a plurality of discharge signals, wherein the discharge signal is associated with the selected row of the CAM array; and
simultaneously performing the read operation and a search operation in the CAM array, wherein the read operation comprises reading a read data value from the selected row of the CAM array and placing a match line associated with the selected row of the CAM array in a state associated with a non-match condition of the search operation.

11. The method of claim 10, wherein the search operation comprises applying a search data value to the CAM array and placing match lines associated with all rows of the CAM array except for the selected row in a state associated with a match condition of the search operation.

12. The method of claim 11, further comprising comparing the read data value with the search data value, the comparison occurring outside of the CAM array.

13. The method of claim 11, further comprising:
providing a first search result in response to the search operation;
comparing the read data value with the search data value to provide a second search result; and
providing a third search result in response to the first search result and the second search result.

14. A content addressable memory (CAM) system comprising:
a CAM array including a plurality of CAM cells arranged in rows and columns, wherein each of the rows includes a corresponding match line for indicating a match or non-match condition during a search operation;
a controller that initiates a read operation from a selected row of the CAM array and a search operation to the CAM array during a first cycle of the CAM system; and
a match line pre-charge circuit that is configured to (i) receive one or more signals corresponding to the read operation and the search operation from the controller, and (ii) decode the one or more signals to activate a discharge signal associated with the selected row from a plurality of discharge signals and activate a plurality of pre-charge signals;
wherein the discharge signal discharges the match line corresponding with the selected row of the CAM array, and the plurality of pre-charge signals pre-charges all other match lines of the CAM array during the first cycle of the CAM system.

15. The CAM system of claim 14, wherein the CAM cells comprise dynamic random access memory (DRAM) cells.

16. The CAM system of claim 14, wherein the CAM cells comprise static random access memory (SRAM) cells.

17. The CAM system of claim 14, further comprising a priority encoder coupled to the match lines of the CAM array, wherein the priority encoder provides a first search result of the search operation.

18. The CAM system of claim 17, further comprising a comparator that compares a read data value read from the selected row during the read operation with a search data value that is provided to the CAM array during the search operation, wherein the comparator provides a second search result.

19. The CAM system of claim 18, further comprising a priority comparator that receives the first search result from the priority encoder, and the second search result from the comparator, and in response, provides a third search result.

* * * * *